(12) United States Patent
Herrmann et al.

(10) Patent No.: US 8,058,147 B2
(45) Date of Patent: Nov. 15, 2011

(54) METHOD FOR PRODUCING SEMICONDUCTOR COMPONENTS AND THIN-FILM SEMICONDUCTOR COMPONENT

(75) Inventors: Siegfried Herrmann, Neukirchen (DE); Berthold Hahn, Hemau (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 232 days.

(21) Appl. No.: 11/990,099

(22) PCT Filed: Aug. 4, 2006

(86) PCT No.: PCT/DE2006/001367
§ 371 (c)(1),
(2), (4) Date: Jun. 16, 2008

(87) PCT Pub. No.: WO2007/016908
PCT Pub. Date: Feb. 15, 2007

(65) Prior Publication Data
US 2010/0133564 A1 Jun. 3, 2010

(30) Foreign Application Priority Data

Aug. 5, 2005 (DE) .................. 10 2005 037 023
Nov. 21, 2005 (DE) .................. 10 2005 055 293

(51) Int. Cl.
*H01L 21/302* (2006.01)
(52) U.S. Cl. ........... 438/458; 438/22; 438/483; 438/796
(58) Field of Classification Search .................. 438/458, 438/22, 483, 796
See application file for complete search history.

(56) References Cited

U.S. PATENT DOCUMENTS

| | | | |
|---|---|---|---|
| 4,894,751 | A | 1/1990 | Wehnelt |
| 5,779,924 | A | 7/1998 | Krames et al. |
| 5,833,073 | A | 11/1998 | Schatz et al. |
| 6,071,795 | A | 6/2000 | Cheung et al. |
| 6,372,608 | B1 | 4/2002 | Shimoda et al. |
| 6,559,075 | B1 | 5/2003 | Kelly et al. |
| 6,562,648 | B1 | 5/2003 | Wong et al. |
| 6,770,936 | B2 | 8/2004 | Inoue et al. |
| 6,876,003 | B1 | 4/2005 | Nakamura et al. |
| 6,878,563 | B2 | 4/2005 | Bader et al. |
| 6,906,346 | B2 | 6/2005 | Nishitani et al. |
| 6,956,246 | B1 | 10/2005 | Epler et al. |
| 7,078,737 | B2 | 7/2006 | Yuri et al. |

(Continued)

FOREIGN PATENT DOCUMENTS

CN 1656620 8/2005

(Continued)

OTHER PUBLICATIONS

Schnitzer I. et al.: "30% External quantum efficiency from surface textured, thin-film light-emitting diodes" Appl. Phys. Lett. vol. 63 No. 16, Oct. 18, 1993, pp. 2174-2176.

(Continued)

*Primary Examiner* — Long Pham
(74) *Attorney, Agent, or Firm* — Cozen O'Connor

(57) ABSTRACT

The invention relates to a method for producing semiconductor components, wherein a layer composite (6) containing a semiconductor material is formed on a growth substrate (1), a flexible carrier layer is applied to the layer composite (6), the flexible carrier layer is cured to form a self-supporting carrier layer (2), and the growth substrate (1) is stripped away. As an alternative, the carrier layer (2) may have a base layer (2*b*) and an adhesion layer (2*a*) adhering on the layer composite.

38 Claims, 5 Drawing Sheets

U.S. PATENT DOCUMENTS

| | | |
|---|---|---|
| 7,265,392 B2 | 9/2007 | Hahn et al. |
| 2003/0075723 A1 | 4/2003 | Heremans et al. |
| 2003/0153108 A1 | 8/2003 | Durocher et al. |
| 2003/0178627 A1 | 9/2003 | Marchl et al. |
| 2003/0189829 A1 | 10/2003 | Shimizu et al. |
| 2004/0033638 A1 | 2/2004 | Bader et al. |
| 2004/0047151 A1 | 3/2004 | Bogner et al. |
| 2004/0099873 A1 | 5/2004 | Illek |
| 2004/0110316 A1 | 6/2004 | Ogihara et al. |
| 2004/0113167 A1 | 6/2004 | Bader et al. |
| 2004/0068572 A1 | 8/2004 | WOX |
| 2004/0149810 A1 | 8/2004 | Yang et al. |
| 2004/0211968 A1 | 10/2004 | Lin et al. |
| 2005/0033638 A1 | 2/2005 | Donnet |
| 2005/0105878 A1 | 5/2005 | Wu |
| 2005/0110033 A1 | 5/2005 | Heremans et al. |
| 2005/0148106 A1 | 7/2005 | Iwafuchi et al. |
| 2005/0151147 A1 | 7/2005 | Izuno et al. |
| 2005/0199891 A1 | 9/2005 | Kunisato et al. |
| 2005/0212007 A1 | 9/2005 | Daniels et al. |
| 2005/0212098 A1 | 9/2005 | Bogner et al. |
| 2005/0239270 A1 | 10/2005 | Fehrer et al. |
| 2005/0274971 A1 | 12/2005 | Wang et al. |
| 2006/0011923 A1 | 1/2006 | Eisert et al. |
| 2006/0011925 A1 | 1/2006 | Bader et al. |
| 2006/0043384 A1 | 3/2006 | Cho et al. |
| 2006/0049423 A1 | 3/2006 | Yamaguchi et al. |
| 2006/0051937 A1 | 3/2006 | Ploessl et al. |
| 2006/0056474 A1 | 3/2006 | Fujimoto et al. |
| 2006/0065905 A1 | 3/2006 | Eisert et al. |
| 2006/0091409 A1 | 5/2006 | Epler et al. |
| 2006/0097354 A1 | 5/2006 | Ogihara et al. |
| 2006/0145170 A1 | 7/2006 | Cho |
| 2006/0163595 A1 | 7/2006 | Hsieh et al. |
| 2006/0175625 A1 | 8/2006 | Yokotani et al. |
| 2006/0211923 A1 | 9/2006 | Al-Ali et al. |
| 2006/0237735 A1 | 10/2006 | Naulin et al. |
| 2007/0010067 A1 | 1/2007 | Shimoda et al. |
| 2007/0190290 A1 | 8/2007 | Gunther et al. |
| 2008/0128731 A1 | 6/2008 | DenBaars et al. |
| 2008/0225523 A1 | 9/2008 | De Samber et al. |
| 2009/0127573 A1 | 5/2009 | Guenther et al. |

FOREIGN PATENT DOCUMENTS

| | | |
|---|---|---|
| CN | 1271182 | 10/2005 |
| DE | 100 17 336 | 10/2001 |
| DE | 100 20 464 | 11/2001 |
| DE | 100 40 448 | 3/2002 |
| DE | 10 051 465 | 5/2002 |
| DE | 103 03 977 | 11/2003 |
| DE | 102 34 978 | 2/2004 |
| DE | 202 20 258 | 2/2004 |
| DE | 102 45 628 | 4/2004 |
| DE | 102 45 631 | 4/2004 |
| DE | 103 39 985 | 3/2005 |
| DE | 103 53 679 | 6/2005 |
| DE | 10 2005 013 894 | 1/2006 |
| DE | 10 2004 036 962 | 3/2006 |
| DE | 10 2004 050 371 | 4/2006 |
| DE | 10 2005 055 293 | 2/2007 |
| DE | 100 41 328 | 3/2007 |
| DE | 10 2007 004 301 | 2/2008 |
| DE | 10 2007 004 303 | 2/2008 |
| DE | 10 2007 004 304 | 7/2008 |
| EP | 0 404 565 | 12/1990 |
| EP | 0 977 277 | 2/2000 |
| EP | 1 351 308 | 10/2003 |
| EP | 1 653 523 | 5/2006 |
| EP | 1 657 739 | 5/2006 |
| GB | 2 311 413 | 9/1997 |
| JP | 9-92878 | 4/1997 |
| JP | 11-97518 | 4/1999 |
| JP | 2000-49382 | 2/2000 |
| JP | 2001-168344 | 6/2001 |
| JP | 2006-147787 | 6/2006 |
| JP | 2006-147787 | 8/2006 |
| KR | 10-0599012 | 7/2006 |
| KR | 10 0599012 | 7/2006 |
| TW | 416150 | 12/2000 |
| TW | 515103 | 12/2002 |
| WO | WO 98/14986 | 4/1998 |
| WO | WO 2004/068572 | 8/2004 |
| WO | WO 2005/099310 | 10/2005 |
| WO | WO 2005/100016 | 10/2005 |
| WO | WO 2006/034671 | 4/2006 |
| WO | WO 2007/001124 | 1/2007 |
| WO | WO 2007/016908 | 2/2007 |
| WO | WO 2008/014750 | 2/2008 |
| WO | WO 2008/092774 | 8/2008 |

OTHER PUBLICATIONS

Data Sheet TechFilm BOLGER C-14 F, Polytec PT, Version 1, Jun. 2002 (pp. 2).

3M Grounded Heat Sink Bonding Film, 7373, pp. 1-4.

"Curtain Coating", P2005,0612 (pp. 2).

M³D™ and Maskless Mesoscale™ Materials Deposition, OPTOMEC (pp. 2).

Preliminary Report on Patentability dated Mar. 12, 2008 issued for the underlying International PCT Application No. PCT/DE2006/001367.

Office Action for U.S. Appl. No. 12/525,066 dated Sep. 7, 2011.

METHOD FOR PRODUCING SEMICONDUCTOR COMPONENTS AND THIN-FILM SEMICONDUCTOR COMPONENT

RELATED APPLICATIONS

This is a U.S. national stage of application No. PCT/DE2006/001367, filed on 4 Aug. 2006.

This patent application claims the priority of German patent application nos. 10 2005 037 023.3 filed Aug. 5, 2005 and 10 2005 055 293.5 filed Nov. 21, 2005, the disclosure content of which is hereby incorporated by reference.

BACKGROUND OF THE INVENTION

The invention relates to a method for producing semiconductor components, and to a thin-film semiconductor component.

It is an object of the present invention to specify a simplified method for producing semiconductor components. It is furthermore an object of the present invention to specify a thin-film semiconductor component which can be handled easily and is mechanically stable.

A first variant of a method according to the invention for producing semiconductor components comprises the following steps:
forming a layer composite containing a semiconductor material on a growth substrate,
applying a flexible carrier layer to the layer composite,
curing the flexible carrier layer to form a self-supporting carrier layer,
stripping away the growth substrate.

Therefore, a flexible carrier layer is applied on that side of the layer composite which is remote from the growth substrate, said carrier layer adhering to the layer composite after curing as a self-supporting preferably rigid, carrier layer.

A second variant of a method according to the invention for producing semiconductor components comprises the following steps:
forming a layer composite containing a semiconductor material on a growth substrate,
applying a self-supporting carrier layer to the layer composite, wherein the carrier layer has a base layer and an adhesion layer, which faces the layer composite and which adheres on the layer composite,
stripping away the growth substrate.

Therefore, a carrier layer is applied on that side of the layer composite which is remote from the growth substrate, said carrier layer adhering to the layer composite as a self-supporting, preferably rigid, carrier layer in the finished semiconductor component.

A separate connection between the layer composite and the carrier layer, for instance a soldering connection, and as a result a method step that causes costs, bonding, can advantageously be obviated.

In accordance with the first variant, the self-supporting carrier layer has the advantage over the flexible carrier layer that it is more fixed in shape and can therefore be handled more easily.

In the case of the second variant, the adhesion layer can be formed from a hot melt adhesive and the base layer can be formed from a dimensionally stable plastic. In this case, it is necessary to heat the adhesion layer in order to melt the latter and to obtain a sufficient wetting of the layer composite and thus a sufficient adhesion after curing. The adhesion layer is preferably solid at room temperature. Furthermore, it is conceivable for the adhesion layer to adhere on the layer composite without additional heating. In this case, the adhesion layer can contain for example silicone and the base layer polyimide.

In a preferred embodiment of the second variant of the method, the base layer contains a plastic material. As an alternative, the base layer can contain glass.

The carrier layer is preferably a film. In particular, the carrier layer can be a plastic sheet produced in tracks. A sufficient stability can be achieved even when the carrier layer according to the invention has a relatively small thickness. This is because the carrier layer is elastic on account of the relatively small thickness, thereby reducing the risk of cracking. In this case, a relatively small thickness should be understood to mean preferably 100 µm, particularly preferably less than 100 µm.

The carrier layer is particularly preferably transparent. This has the advantage that the carrier layer can simultaneously serve as a coupling-out layer.

Preferably thin-film semiconductor components, in particular radiation-emitting thin-film semiconductor components, are produced by the method according to the invention.

A radiation-emitting thin-film semiconductor component is distinguished in particular by at least one of the following characteristic features:
a reflective layer is preferably applied or formed at a first main area—facing towards a carrier element—of a radiation-generating epitaxial layer sequence, said reflective layer reflecting at least part of the electromagnetic radiation generated in the epitaxial layer sequence back into the latter;
the epitaxial layer sequence has a thickness in the region of 20 µm or less, in particular in the region of 10 µm; and
the epitaxial layer sequence contains at least one semiconductor layer having at least one area which has an intermixing structure which ideally leads to an approximately ergodic distribution of the light in the epitaxial layer sequence, that is to say that it has an as far as possible ergodically stochastic scattering behaviour.

A basic principle of a radiation-emitting thin-film semiconductor component is described for example in I. Schnitzer et al., "30% external quantum efficiency from surface textured, thin-film light-emitting diodes", Appl. Phys. Lett. 63 (16), 18 Oct. 1993, 2174-2176, the disclosure content of which in this respect is hereby incorporated by reference.

A radiation-emitting thin-film semiconductor component of this type is to a good approximation a Lambertian surface emitter.

In the case of the invention, the layer composite accordingly has an active layer sequence for generating electromagnetic radiation, said active layer sequence preferably being grown epitaxially on the growth substrate.

In order to produce a plurality of thin-film semiconductor components, the layer composite is structured into individual layer stacks. The latter can be singulated by sawing, for example.

The carrier layer can be applied to the layer composite in prestructured fashion, such that the layer composite can be singulated into layer stacks along the structure.

In a preferred embodiment of the first variant of the method according to the invention, a carrier layer having a plastic material is used. A carrier layer of this type particularly preferably contains an epoxy resin, PET (polyethylene terephthalate) or a polymer in particular a polyimide, for example Kapton or a combination of these materials. Kapton is the trade name of the polyimide products offered by the company DuPont.

In a conventional method, temperatures in the region of 400° C. are typically reached when bonding the layer composites onto the carrier body. During subsequent cooling down to room temperature, a strain or warpage can occur if the coefficients of thermal expansion of the growth substrate and of the carrier body deviate greatly from one another. Furthermore, cracks can thereby occur in the carrier body, such that the resulting component no longer has sufficient stability.

Since the method according to the invention manages with lower temperatures, smaller thermal strains occur, whereby the risk of cracking is advantageously reduced.

By way of example, a carrier layer containing a silver-filled epoxy resin is melted at 80° C. to 90° and cured at a temperature of 150° C., a deviation of 10% being tolerable.

Another possibility for a carrier layer according to the invention is an adhesive film filled with glass particles. Said film can be formed from a hybrid material containing in particular an epoxy resin and an acrylate. Glass particles with a silver coating are incorporated into the hybrid material, the adhesive film advantageously being electrically conductive by means of the glass particles. The adhesive film can be melted at 120° C. and cured at 160° C. for 30 minutes.

In order to be able to dissipate the heat loss that arises during operation in the case of a semiconductor component produced in accordance with the method according to the invention, the carrier layer is preferably formed in thermally conductive fashion. As a result, undesirable effects such as a shift in the wavelength or a reduction of the intensity of the radiation emitted by the semiconductor component can be avoided.

In a preferred embodiment of a method according to the invention, the carrier layer is formed with an electrically insulating material. At least one electrical conductor track can be applied to the carrier layer in order subsequently to connect an arrangement comprising layer stack applied on a common carrier layer or a singulated component to an electrode.

As an alternative, the carrier layer can be formed with an electrically conductive material. By way of example, the carrier layer contains a metal, in particular Al, Ag, Ti, Cu, or an alloy, in particular brass.

For an electrical contact-connection of semiconductor components, the layer composite is provided with a contact area, in particular a contact metallization, containing a metal, on the side facing the carrier layer.

In a preferred embodiment of the method according to the invention, a material which at least partly reflects the radiation generated by an active layer stack during later operation is chosen for the contact metallization. This is advantageous primarily when the carrier layer is not transmissive to the radiation generated and the radiation is coupled out from the side of the semiconductor component opposite to the carrier layer.

The growth substrate is preferably removed by means of a laser stripping method such as is known for example from U.S. Pat. No. 6,559,075, the content of which is hereby incorporated by reference. The growth substrate can also be stripped away by other methods, such as plasma or dry etching, or be removed mechanically.

After the growth substrate has been stripped away, preferably a second contact area, in particular a contact metallization, provided for a further electrical contact-connection of the subsequent thin-film semiconductor components, is applied on that side of the layer composite which is remote from the carrier layer.

Moreover, a flexible covering layer can be applied on that side of the layer stack which is remote from the carrier layer, which covering layer can be cured. As an alternative, the flexible covering layer can be left in an incompletely cured state.

A further possibility consists in applying a covering layer having a base layer and an adhesion layer facing the layer composite, wherein the adhesion layer adheres on the layer composite.

In particular, the covering layer can be a film.

Preferably, the covering layer is transmissive to the radiation generated by the active layer. In an advantageous embodiment, the covering layer contains a converter material for the proportional wavelength conversion of the radiation generated by the subsequent active layer stack.

The covering layer particularly preferably has properties corresponding to the carrier layer. However, it can also contain a different material from the carrier layer.

In accordance with a preferred variant, the covering layer is formed from glass. Furthermore, the covering layer can have on a side facing the layer composite, for making contact with the thin-film semiconductor component on the top side, at least one conductor track containing, in particular, a radiation-transmissive material such as ITO (indium tin oxide).

A bilateral arrangement of the carrier layer and the covering layer can advantageously replace a housing body.

A thin-film semiconductor component according to the invention in accordance with a first variant, which can preferably be produced in accordance with the first variant of the method according to the invention, has the following constituent parts:
    a layer stack,
    a self-supporting, preferably rigid, carrier layer arranged on the layer stack, wherein the carrier layer is cured.

A thin-film semiconductor component according to the invention in accordance with a second variant, which can preferably be produced in accordance with the second variant of the method according to the invention, has the following constituent parts:
    a layer stack,
    a self-supporting carrier layer arranged on the layer stack, wherein the carrier layer has a base layer and an adhesion layer, which faces the layer stack and which adheres on the layer stack.

In particular, the carrier layer has the properties that have already been mentioned in connection with the first and second variants of the method.

Since there is a sufficient mechanical stability in a thin-film semiconductor component with a carrier layer according to the invention, no additional carrier is required. Consequently, the semiconductor component can be embodied with an advantageously small structural height, for example 120 μm.

The thin-film semiconductor component is provided for generating electromagnetic radiation and for this purpose has an active layer stack, which is part of the layer stack. By way of example, the active layer stack can have a conventional pn-junction, a double heterostructure, a single quantum well structure or a multiple quantum well structure.

Furthermore, in a preferred embodiment, the thin-film semiconductor component has a nitride component semiconductor, which means that the active layer stack or at least one layer thereof comprises a nitride III/V compound semiconductor material, preferably $Al_nGa_mIn_{1-n-m}N$, where $0 \leq n \leq 1$, $0 \leq m \leq 1$ and $n+m \leq 1$. In this case, this material need not necessarily have a mathematically exact composition according to the above formula. Rather, it can have one or more dopants and also additional constituents which essentially do not change the characteristic physical properties of the $Al_nGa_mIn_{1-n-m}N$ material. For the sake of simplicity, however, the above formula only comprises the essential constituents of the crystal lattice (Al, Ga, In, N), even if these can be replaced in part by small quantities of further substances, for example P.

A thin-film semiconductor component having a nitride compound semiconductor principally emits radiation having a wavelength in the short-wave range of the visible optical spectrum.

The wavelength can be converted at least partly into a longer wavelength by means of a converter element disposed downstream of the layer stack in the emission direction.

In particular, a converter material can be integrated into the thin-film semiconductor component preferably in the covering layer.

According to the invention, the carrier layer can contain a plastic material. Materials which are preferred for the carrier layer are for example an epoxy resin, PET, a polymer, in particular polyimide, for example Kapton, or a combination of these materials.

Furthermore, the carrier layer or the covering layer can have any of the properties mentioned in connection with the method according to the invention. The same correspondingly applies to the thin-film semiconductor component.

Furthermore, in a preferred embodiment, the carrier layer contains carbon fibres. The latter can for example be embedded into a polymer film and have a higher thermal conductivity than the polymer film, such that overall an adhering and thermally conductive layer advantageously results therefrom.

Moreover, the carrier layer can have a glass fabric, in particular a silicate.

In a further preferred embodiment, the carrier layer is transmissive to the radiation generated by the active layer stack. This has the advantage that the radiation can couple out directly and radiation losses that can occur as a result of absorption of reflected radiation in the active layer stack are reduced.

It is conceivable that the covering layer is applied on the side remote from the carrier layer, which covering layer can be left in the incompletely cured state, but is preferably formed in self-supporting fashion, in particular rigidly, and has properties corresponding to the carrier layer.

In an advantageous embodiment, the covering layer contains a converter material for the proportional wavelength conversion of the radiation generated by the active layer stack. The covering layer can furthermore have an optical structure. The optical structure can be provided on a side of the covering layer which faces or is remote from the layer stack. The emission characteristic of the radiation generated in the thin-film semiconductor component can advantageously be influenced by means of the optical structure. By way of example, the optical structure can be formed in lens-type, prism-type or pyramidal fashion.

Since the layer stack typically has a height in the region of 20 μm or of 10 μm, the carrier layer and the covering layer, whose thickness is particularly preferably less than or equal to 100 μm, can enclose the layer stack. This has the advantage that a further housing body is not necessary.

In accordance with a preferred embodiment, a filling layer is arranged between the carrier layer and the covering layer. The filling layer can contain a plastic material, for example.

Furthermore, the thin-film semiconductor component can be incorporated into a housing body.

In a particular embodiment, both the carrier layer and the covering layer are transmissive to the radiation generated by the active layer stack, which leads to a thin-film semiconductor component which is emissive on two sides.

In the figures:

DETAILED DESCRIPTION OF THE DRAWINGS

In the exemplary embodiments identical or identically acting constituent parts are in each case provided with the same reference symbols. The constituent parts illustrated in the figures, in particular the sizes of layer thicknesses illustrated, should not, in principle, be regarded as true to scale. Rather, they may be illustrated in part with an exaggerated size for the sake of better understanding.

FIGS. 1a to 1f respectively illustrate a production step of a first exemplary embodiment of the method according to the invention.

Figure 1A:
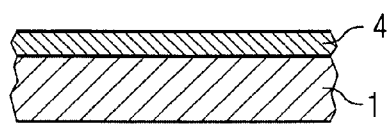
FIGS. 1a to 1f show a schematic illustration of a first exemplary embodiment of a method according to the invention on the basis of six production steps.

In a first production step illustrated in FIG. 1a, an active layer sequence 4 is applied on a growth substrate 1. This can be effected for example by epitaxial growth of a plurality of different layers, which preferably contain a nitride compound semiconductor in accordance with the definition mentioned above, on a sapphire or SiC substrate. The active layer sequence 4 thus produced is preferably suitable for generating electromagnetic radiation. Its structure is configured in accordance with one of the possibilities mentioned above.

Figure 1B:
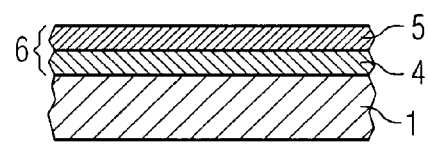

FIG. 1b illustrates a second production step, in which a contact metallization 5 is applied on the active layer sequence 4. The active layer sequence 4 and the contact metallization 5 together form the layer composite 6. The contact metallization 5 is electrically conductive and, during subsequent operation of a component formed from the layer composite, inter alia, additionally reflects the radiation emitted by an active layer stack 40.

The contact metallization 5 can be applied over the whole area on the active layer sequence 4. As an alternative, the contact metallization 5 can be applied partially, for example by means of a mask, at the locations at which layer stacks are subsequently formed.

The contact metallization 5 preferably contains a metallic material such as Ag, Al or Au, which is applied by vapour deposition, for example. Furthermore, layers having integrated electrical contacts and different dielectric constants which form a Bragg mirror, can be arranged on the active layer sequence 4.

In a subsequent component, the contact metallization 5 can simultaneously form a rear-side electrical contact.

Figure 1C:
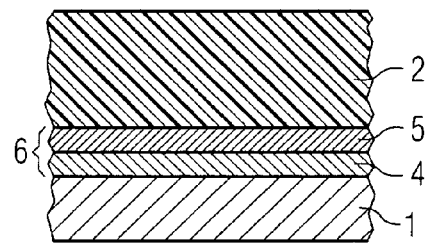

In a third production step illustrated in FIG. 1c firstly a common flexible carrier layer 2 is arranged on the layer composite 6 and is subsequently cured to form a rigid, self-supporting carrier layer 2. The thickness of the carrier layer 2 is preferably chosen in the region of 100 µm.

By way of example, a silver-filled epoxy adhesive film containing 80% silver and 20% non-volatile epoxy resin is used for the carrier layer 2. The silver-filled epoxy adhesive film is applied to the layer composite 6 and subsequently heated from 80° C. to 90° C. In this case, the adhesive film is readily melted, whereby it obtains a good primary adhesion. The film is subsequently cured at temperatures of approximately 150° C. The resultant carrier layer 2 is electrically conductive and has a glass transition temperature of 150 to 155° C. Furthermore, the carrier layer 2 is thermally and chemically resistant.

In particular any other material, preferably a plastic material, which has properties corresponding to the properties illustrated by way of example on the basis of the epoxy adhesive film can be used for the carrier layer 2.

In a further variant, the carrier layer 2 comprises a filled adhesive film. The latter is formed from a hybrid material containing an epoxy resin and an acrylate. Glass particles with a silver coating are embedded into the hybrid material, the adhesive film advantageously being electrically conductive by means of the glass particles. The adhesive film can be melted at 120° C. and be cured at 160° C. for 30 minutes.

Figure 1D:
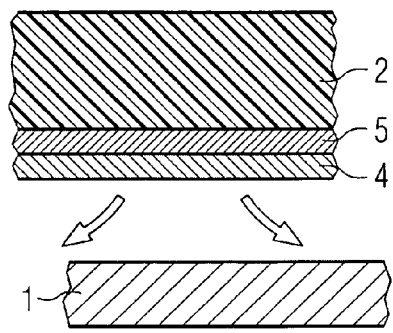

FIG. 1d illustrates fourth production step, in which the growth substrate 1 is stripped away from the layer composite 6. The stripping can be effected by means of a laser stripping method such as is known for example from the above-mentioned U.S. Pat. No. 6,559,075. As an alternative, the stripping can be effected by etching or some other suitable lift-off method.

A laser stripping method essentially involves irradiating an interface between the growth substrate 1 and the active layer sequence 4 with electromagnetic radiation, preferably laser radiation, through the growth substrate 1, such that a material decomposition takes place at the interface as a result of absorption of the radiation. The growth substrate 1 and the active layer sequence 4 can thereby be separated from one another essentially non-destructively. Consequently, the growth substrate 1 can be reused.

Figure 1E:
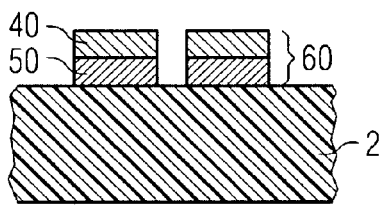

In a fifth production step illustrated in FIG. 1e, mutually separate layer stacks 60 having an active layer stack 40 and in each case an electrically conductive contact metallization 50 are formed from the layer composite 6 on the carrier layer 2. This is done for example by wet-chemical etching or dry etching.

As an alternative, the layer composite 6 can already be separated into individual layer stacks 60 during the production step described in connection with FIG. 1b.

This can likewise be done by etching, for example by plasma etching.

Figure 1F:
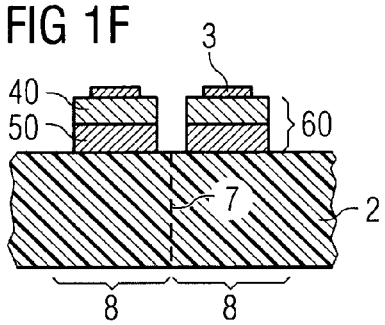

FIG. 1f illustrates a sixth production step, in which a second contact metallization 3 for example for making contact with the subsequent semiconductor components on the top side is applied to the layer stacks 60.

The layer stacks 60 together with the carrier layer 2 can be severed, in particular sawn apart, along the separating plane 7. This results in individual semiconductor components 8 which can be individually incorporated in a housing body.

A further production step can be added, in which, prior to the severing process, a flexible covering layer is applied on the layer stacks 60 on the opposite side to the carrier layer 2, which covering layer can subsequently be cured to form a rigid, self-supporting covering layer or, as an alternative, can be left in an incompletely cured state.

It should be pointed out that the method according to the invention is not fixed to the order specified in accordance with the embodiment.

Figure 2:
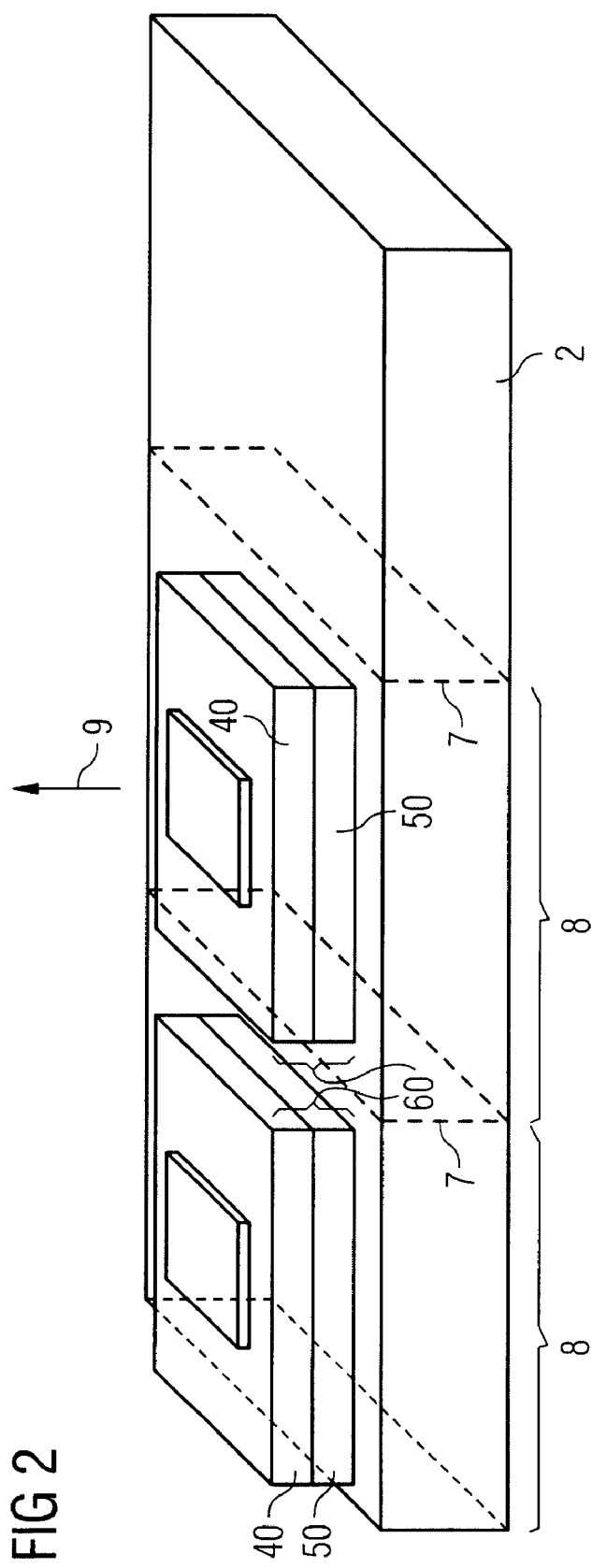
FIG. 2 shows a schematic perspective illustration of a first exemplary embodiment of thin-film semiconductor components according to the invention.

FIG. 2 illustrates layer stacks 60 that are preferably produced in accordance with the method according to the invention.

The layer stacks 60 comprise the contact metallization 50 and the active layer stacks 40. The height of the layer stacks 60 is approximately 10 µm. The second contact metallization 3 is applied on the active layer stack 40. The layer stacks 60 are arranged on the rigid, self-supporting carrying layer 2, which approximately has a thickness of 100 µm.

In accordance with a first embodiment, the semiconductor components 8 are present in singulated fashion, severed along the separating plane 7. They can be incorporated as individual semiconductor components for example in a housing body. Since the carrier layer is formed in a rigid, self-supporting and sufficiently stable manner, the semiconductor components 8 can be handled easily without the need for an additional auxiliary carrier for further processing.

Furthermore, the carrier layer 2 is preferably formed in electrically conductive fashion, such that the semiconductor component 8 can be connected to a first electrode on the rear side via the carrier layer 2. The semiconductor component 8 can be connected to a second electrode on the top side via the second contact metallization 3. Furthermore, the contact metallization 50 is electrically conductive and reflects the radiation generated by the active layer stack 40. The radiation efficiency in the emission direction 9 can thereby be increased.

In accordance with a second embodiment, the carrier layer 2 is not severed. Rather, the layer stacks 60 arranged on the carrier layer 2 form a matrix. The carrier layer 2 can be electrically conductive, for example. As an alternative, the carrier layer 2 can be electrically insulating and have separately applied conductor tracks. Said conductor tracks can connect the layer stacks 60 to one another in any desired, predetermined manner.

A matrix arrangement of this type can be used for example for a display or a display backlighting.

Figure 3:
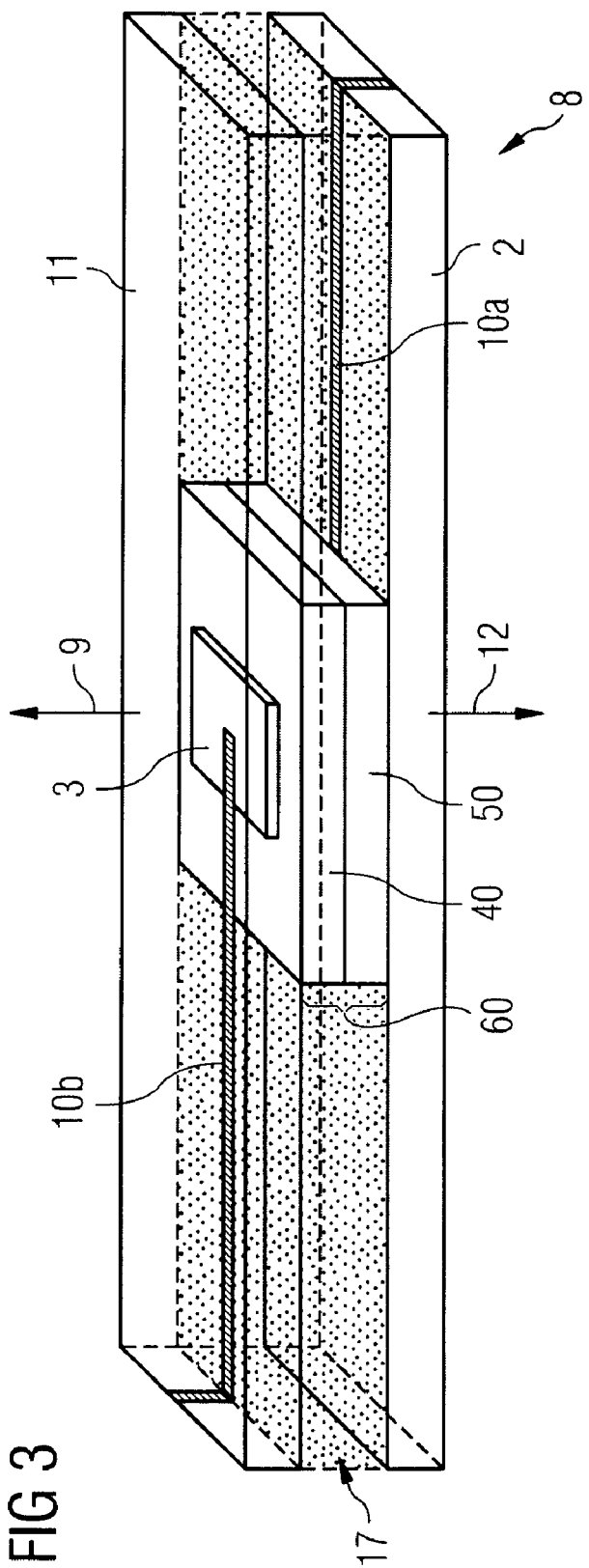
FIG. 3 shows a schematic perspective illustration of a second exemplary embodiment of a thin-film semiconductor component according to the invention.

FIG. 3 illustrates a semiconductor component 8 according to the invention which has the layer stack 60 arranged on the carrier layer 2, with the second contact metallization 3 applied on said layer stack.

In this exemplary embodiment, the contact metallization 50 is electrically conductive and transmissive to the radiation generated by the active layer stack 40. Furthermore, the carrier layer 2 is electrically insulating and transmissive to the radiation generated by the active layer stack 40.

A covering layer 11 is arranged on the side of the semiconductor component 8 opposite to the carrier layer 2. Like the carrier layer 2, the covering layer 11 is electrically insulating and transmissive to the radiation generated by the active layer stack 40. Consequently, the thin-film semiconductor component 8 emits both in emission direction 9 and in emission direction 12. The covering layer 11 and also the carrier layer 2 can have an optical structure, as already mentioned above.

The two layers 2 and 11 preferably contain a plastic material.

The carrier layer 2 and the covering layer 11 have conductor tracks 10a,b which connect the thin-film semiconductor component 8 to a voltage supply. The carrier layer 2 and the covering layer 11 can be provided with the conductor tracks 10a,b prior to application to the layer stack 60. A filling layer 17 can be arranged between the carrier layer 2 and the covering layer 11. Preferably, the filling layer 17 contains an electrically insulating material, thereby preventing a short circuit between the carrier layer 2 and the covering layer 11.

The thin-film semiconductor component 8 illustrated has a sufficient mechanical stability, such that further incorporation into a housing body can be dispensed with. This is because, on account of the small height (approximately 10 μm) of the layer stack 60 in comparison with the thickness of the carrier layer 2 and the flexible carrier layer 11 (approximately 100 μm), the layer stack 60 is virtually enclosed by the two layers 2 and 11.

Figure 4:
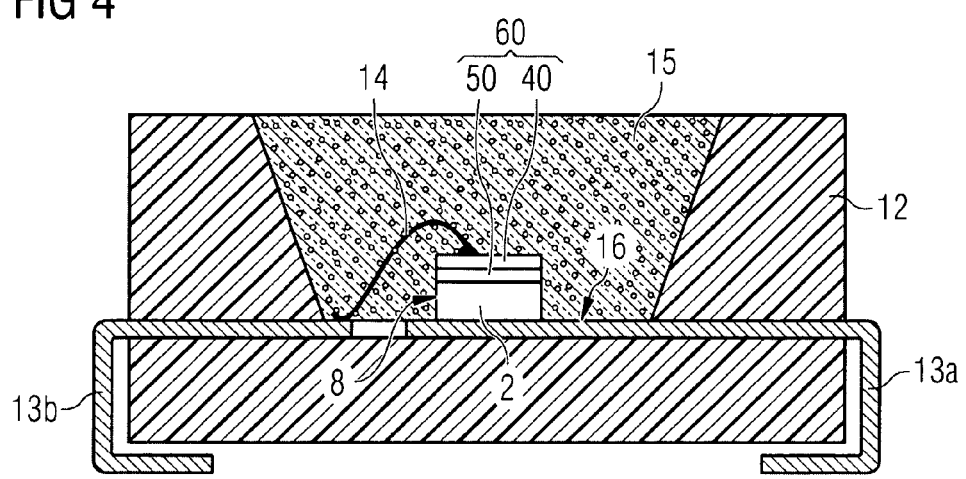
FIG. 4 shows a schematic sectional view of the thin-film semiconductor component according to the invention in accordance with the first exemplary embodiment which is arranged in a housing body.
Figure 5A:
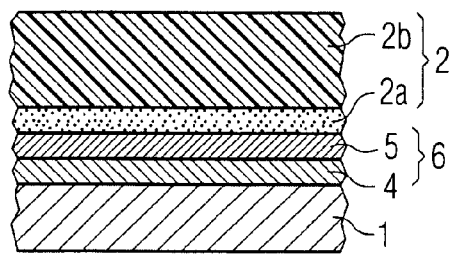
FIGS. 5a to 5d show a schematic illustration of a second exemplary embodiment of a method according to the invention on the basis of four production steps.
Figure 5B:
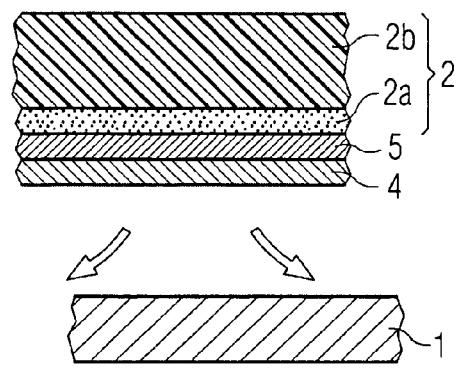
Figure 5C:
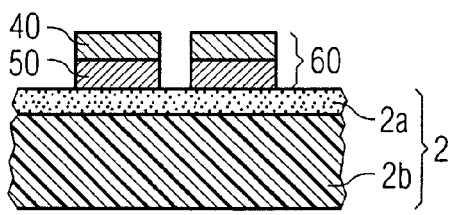
Figure 5D:
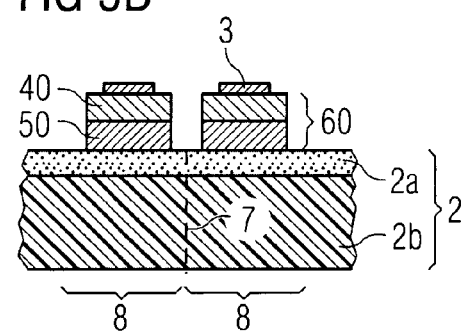

The thin-film semiconductor component 8 shown in FIG. 4 is arranged in a housing body 12. For the mounting of the semiconductor component 8, the carrier layer 2 is melted and cured. After curing, the semiconductor element 8 is fixed on the mounting area 16. The carrier layer 2 advantageously contains an electrically conductive material as already described in connection with FIG. 2, such that a rear-side electrical connection by means of the carrier layer 2 is possible. The mounting area 16 is preferably provided on a first part 13a of a leadframe, such that the thin-film semiconductor component 8 can be electrically connected on the rear side by means of the lead frame 13a. On the top side, the thin-film semiconductor component 8 is electrically connected to a second lead frame 13b by means of an electrical conductor 14. The thin-film semiconductor component 8 is embedded into a potting 15.

The second exemplary embodiment of a method according to the invention described in connection with Figures 5a to 5d can have, as first method steps, the method steps already described in connection with FIGS. 1a and 1b. The subsequent steps are illustrated in FIGS. 5a to 5d. They are carried out essentially analogously to the steps of the first exemplary embodiment which are illustrated in FIGS. 1c to 1f. The difference consists in the carrier layer 2, which, in the present case, is formed in two phases. The carrier layer 2 has a base layer 2b and an adhesion layer 2a.

The adhesion layer 2a is formed from an adhesive film containing for example an adhesive silicone material. The adhesion layer 2a is arranged on the base layer 2b, which contains polyimide, for example. As an alternative, the adhesion layer 2a can be formed from a hot melt adhesive, the adhesion layer 2a firstly being melted and cured before it adheres to the layer composite 6.

The semiconductor components described in the present application can also be referred to in the broader sense as "semiconductor chips". For the sake of clarity, the more neutral designation "semiconductor components" was chosen in the present case in order to avoid confusion with the layer composite containing a semiconductor material, that is to say, for instance, the epitaxial semiconductor layer stack. The designation "semiconductor component" corresponds in particular to the designation "semiconductor chip" of the German Patent Application 102005037023.3 and 102005055293.5, the priority of which is claimed.

The invention is not restricted by the description on the basis of the exemplary embodiments. Rather, the invention encompasses any new feature and also any combination of features, which in particular comprises any combination of features in the patent claims, even if this feature or this combination itself is not explicitly specified in the patent claims or exemplary embodiments.

The invention claimed is:

1. A method for producing semiconductor components, comprising the steps of:

forming a layer composite containing a semiconductor material on a growth substrate;

applying a flexible carrier layer to the layer composite;

curing the flexible carrier layer to form a self-supporting carrier layer;

stripping away the growth substrate; and applying a flexible covering layer comprising a film on a side of the layer composite remote from the flexible covering layer;

wherein the flexible covering layer and the flexible carrier layer remain in the produced semiconductor component.

2. A method for producing semiconductor components, comprising the steps of:

forming a layer composite containing a semiconductor material on a growth substrate;

applying a self-supporting carrier layer to the layer composite, the carrier layer having a base layer and an adhesion layer, which faces the layer composite and which adheres on the layer composite;

stripping away the growth substrate; and applying a flexible covering layer comprising a film on a side of the layer composite remote from the flexible covering layer;

wherein the flexible covering layer and the flexible carrier layer remain in the produced semiconductor component.

3. The method according to claim 2, wherein the adhesion layer is formed from a hot melt adhesive.

4. The method according to claim 2, wherein the base layer is formed from a plastic material.

5. The method according to claim 2, wherein the flexible carrier layer is a film.

6. The method according to claim 2, wherein the flexible carrier layer is transparent.

7. The method according to claim 2, wherein the semiconductor components are thin-film semiconductor components.

8. The method according to claim 2, wherein the layer composite has an active layer sequence for generating electromagnetic radiation.

9. The method according to claim 2, wherein the layer composite is structured into individual layer stacks.

10. The method according to claim 1, wherein the flexible carrier layer contains a plastic material.

11. The method according to claim 10, wherein the plastic material contains at least one of an epoxy resin, polyethylene terephthalate and polymer.

12. The method according to claim 10, wherein the plastic material has curing temperatures in the region of 150° C.

13. The method according to claim 2, wherein the flexible carrier layer has a thickness that is less than or equal to 100 μm.

14. The method according to claim 2, wherein the flexible carrier layer contains a thermally conductive material.

15. The method according to claim 2, wherein the flexible carrier layer contains an electrically insulating material.

16. The method according to claim 2, wherein the flexible carrier layer has at least one electrical conductor track.

17. The method according to claim 2, wherein the flexible carrier layer has an electrically conductive material.

18. The method according to claim 8, wherein the layer composite has a first contact metallization on a side facing the flexible carrier layer.

19. The method according to claim 18, wherein the contact metallization at least partly reflects the electromagnetic radiation generated by the active layer sequence.

20. The method according to claim 2, wherein the growth substrate is stripped away by a laser stripping method.

21. The method according to claim 2, wherein the layer composite is provided with a second contact metallization after the growth substrate has been stripped away.

22. The method according to claim 21, wherein a flexible covering layer is applied to the second contact metallization.

23. The method according to claim 22, wherein the flexible covering layer is partly or completely cured.

24. The method according to claim 1, wherein the carrier layer is a film.

25. The method according to claim 1, wherein the flexible carrier layer is transparent.

26. The method according to claim 1, wherein the semiconductor components are thin-film semiconductor components.

27. The method according to claim 1, wherein the layer composite has an active layer sequence for generating electromagnetic radiation.

28. The method according to claim 1, wherein the layer composite is structured into individual layer stacks.

29. The method according to claim 1, wherein the flexible carrier layer has a thickness that is less than or equal to 100 μm.

30. The method according to claim 1, wherein the flexible carrier layer contains a thermally conductive material.

31. The method according to claim 1, wherein the flexible carrier layer contains an electrically insulating material.

32. The method according to claim 1, wherein the flexible carrier layer has an electrically conductive material.

33. The method according to claim 1, wherein the layer composite has a first contact metallization on the side facing the flexible carrier layer.

34. The method according to claim 33, wherein the contact metallization at least partly reflects the radiation generated by an active layer sequence.

35. The method according to claim 1, wherein the growth substrate is stripped away by a laser stripping method.

36. The method according to claim 1, wherein the layer composite is provided with a second contact metallization after the growth substrate has been stripped away.

37. The method according to claim 36, wherein a flexible covering layer is applied to the second contact metallization.

38. The method according to claim 37, wherein the flexible covering layer is partly or completely cured.

* * * * *